United States Patent
Liu et al.

(10) Patent No.: US 11,222,905 B2
(45) Date of Patent: Jan. 11, 2022

(54) PIXEL STRUCTURE, ARRAY SUBSTRATE AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Tingliang Liu, Beijing (CN); Zhonglin Cao, Beijing (CN); Ting Li, Beijing (CN); Pengcheng Zang, Beijing (CN); Weiyun Huang, Beijing (CN); Jia Meng, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 692 days.

(21) Appl. No.: 16/080,115

(22) PCT Filed: Feb. 12, 2018

(86) PCT No.: PCT/CN2018/076570
§ 371 (c)(1),
(2) Date: Aug. 27, 2018

(87) PCT Pub. No.: WO2018/205711
PCT Pub. Date: Nov. 15, 2018

(65) Prior Publication Data
US 2021/0193695 A1 Jun. 24, 2021

(30) Foreign Application Priority Data
May 11, 2017 (CN) .......................... 201710330628.1

(51) Int. Cl.
*H01L 27/12* (2006.01)
*H01L 29/417* (2006.01)

(52) U.S. Cl.
CPC .... *H01L 27/1222* (2013.01); *H01L 29/41733* (2013.01)

(58) Field of Classification Search
CPC ........... H01L 27/1222; H01L 29/41733; H01L 29/78618; H01L 29/0847; H01L 29/66765;
(Continued)

(56) References Cited

U.S. PATENT DOCUMENTS

| 2006/0033446 | A1* | 2/2006 | Kim | ........................ H01L 27/12 315/169.3 |
| 2011/0001736 | A1* | 1/2011 | Tanaka | .................. H01L 27/124 345/204 |

(Continued)

FOREIGN PATENT DOCUMENTS

| CN | 203218262 U | 9/2013 |
| CN | 103367353 A | 10/2013 |

(Continued)

OTHER PUBLICATIONS

International Search Report from PCT/CN2018/076570 dated Nov. 5, 2017.
(Continued)

*Primary Examiner* — Mouloucoulaye Inoussa
(74) *Attorney, Agent, or Firm* — Fay Sharpe LLP

(57) ABSTRACT

Provided are a pixel structure, an array substrate and a display device. The pixel structure includes a first group of TFTs, a second group of TFTs and a pixel electrode. First group of TFTs and second group of TFTs each include at least two TFTs. Source electrodes of all TFTs in first group of TFTs are connected to a same data line, drain electrodes
(Continued)

of all TFTs in first group of TFTs are connected to sources electrodes of all TFTs in second group of TFTs, drain electrodes of all TFTs in second group of TFTs are connected to pixel electrode, and gate electrodes of all TFTs in first group of TFTs and gate electrodes of all TFTs in second group of TFTs are connected to a same gate line. A problem that whole pixel cannot work normally caused by the breakage of area where the channel is formed is avoided.

18 Claims, 4 Drawing Sheets

(58) Field of Classification Search
CPC .......... H01L 29/42384; H01L 27/1214; H01L 27/1251; H01L 27/124; G06F 3/0443; G06F 3/0448; G06F 3/0446; G06F 3/0416; G09G 3/3648
USPC .............. 257/49, 57, 66, E29.291, E29.294, 257/E27.111, E29.117, E29.137, E29.273; 345/174, 104, 204
See application file for complete search history.

(56) References Cited

U.S. PATENT DOCUMENTS

| | | | |
|---|---|---|---|
| 2013/0075728 A1* | 3/2013 | Liu | H01L 27/1214 257/49 |
| 2015/0372016 A1* | 12/2015 | Cheng | H01L 27/124 257/72 |
| 2016/0225787 A1 | 8/2016 | Katsuta et al. | |
| 2019/0296152 A1* | 9/2019 | Gu | H01L 27/1214 |

FOREIGN PATENT DOCUMENTS

| | | |
|---|---|---|
| CN | 104678667 A | 6/2015 |
| CN | 105843439 A | 8/2016 |
| CN | 106526996 A | 3/2017 |
| CN | 106783886 A | 5/2017 |
| CN | 107425013 A | 12/2017 |

OTHER PUBLICATIONS

Chinese Office Action dated Apr. 28, 2018 in the Chinese priority application, S.N. 201710330628.1.

* cited by examiner

PIXEL STRUCTURE, ARRAY SUBSTRATE AND DISPLAY DEVICE

CROSS-REFERENCE TO RELATED APPLICATION

This application is a 371 of PCT Patent Application Serial No. PCT/CN2018/076570, filed on Feb. 12, 2018, which claims priority to Chinese Patent Application No. 201710330628.1, filed with the State Intellectual Property Office on May 11, 2017 and titled "PIXEL STRUCTURE, ARRAY SUBSTRATE AND DISPLAY DEVICE", the entire contents of which are incorporated herein by reference.

TECHNICAL FIELD

The present disclosure relates to a pixel structure, an array substrate and a display device.

BACKGROUND

The electronic paper, which has a display effect approximating that of natural paper, has advantages of low consumption, low cost, easy portability, environmental protection, and etc., and has been widely used in the fields of price tags, watches, smart cards, billboards, product labels, electronic scales, greeting cards, and etc.

The structure of electronic paper is similar to that of a Twisted Nematic (TN) liquid crystal display panel. The pixel structure in the electronic paper includes pixel electrodes and thin film transistors (TFT), so as to guarantee that the voltage in the pixel electrodes may last for a long period of time in the case of power failure, such that the electronic paper may display images for a long period of time in the case of power failure.

SUMMARY

There are provided a pixel structure, an array substrate and a display device in the present disclosure.

There is provided, in at least one embodiment of the present disclosure, a pixel structure, comprising a first group of thin film transistors, a second group of thin film transistors and a pixel electrode, the first group of thin film transistors and the second group of thin film transistors each comprising at least two thin film transistors, source electrodes of all the thin film transistors in the first group of thin film transistors being connected to a same data line, drain electrodes of all the thin film transistors in the first group of thin film transistors being connected to sources electrodes of all the thin film transistors in the second group of thin film transistors, drain electrodes of all the thin film transistors in the second group of thin film transistors being connected to the pixel electrode, and gate electrodes of all the thin film transistors in the first group of thin film transistors and gate electrodes of all the thin film transistors in the second group of thin film transistors being connected a same gate line.

Optionally, the first group of thin film transistors comprises 2-4 thin film transistors, and the second group of thin film transistors comprises 2-4 thin film transistors.

Optionally, a number of the thin film transistors in the first group of thin film transistors is the same as a number of the thin film transistors in the second group of thin film transistors.

Optionally, the drain electrodes of all the thin film transistors in the first group of thin film transistors and the source electrodes of all the thin film transistors in the second group of thin film transistors are in an integral structure, and the integral structure is a circular electrode.

Optionally, the source electrodes of all the thin film transistors in the first group of thin film transistors and the drain electrodes of all the thin film transistors in the second group of thin film transistors are arc electrodes, and the arc electrodes are concentrically arranged with the circular electrode.

Optionally, the arc electrodes are distributed evenly at intervals along a circumference of the circular electrode.

Optionally, a diameter of an outer circle of each of the arc electrodes is twice of a diameter of an outer circle of the circular electrode.

Optionally, a radian of the arc electrode in the first group of thin film transistors is $360°/3A_1$, and $A_1$ is a number of the thin film transistors in the first group of thin film transistors; wherein a radian of the arc electrode in the second group of thin film transistors is $360°/3A_2$, and $A2$ is a number of the thin film transistors in the second group of thin film transistors.

Optionally, the drain electrodes of all the thin film transistors in the first group of thin film transistors and the source electrodes of all the thin film transistors in the second group of thin film transistors are in an integral structure, the integral structure being a polygon electrode.

Optionally, the source electrodes of all the thin film transistors in the first group of thin film transistors and the drain electrodes of all the thin film transistors in the second group of thin film transistor are long strip electrodes.

Optionally, each of the long strip electrodes is arranged corresponding to a side of the polygon electrode respectively, and a length direction of the long strip electrode is parallel with the corresponding side of the long strip electrode in the polygon electrode.

Optionally, a number of sides of the polygon electrode is equal to a sum of a number of the thin film transistors in the first group of thin film transistors and a number of the thin film transistors in the second group of thin film transistors.

Optionally, the polygon electrode is in a regular polygon shape.

Optionally, a width-to-length ratio of a channel of each thin film transistor in the first group of thin film transistors is $W_1/(A_1*L_1)$, $A_1$ is a number of the thin film transistors in the first group of thin film transistors, $W_1/L_1$ is a width-to-length ratio of the channel of the thin film transistor when only one thin film transistor is included in the first group of thin film transistors; and a width-to-length ratio of a channel of each thin film transistor in the second group of thin film transistors is $W_2/(A_2*L_2)$, $A_2$ is a number of the thin film transistors in the second group of thin film transistors, $W_2/L_2$ is a width-to-length ratio of the channel of thin film transistor when only one thin film transistor is included in the second group of thin film transistors.

Optionally, the gate electrodes of the first group of thin film transistors and the second group of thin film transistors are in an integral structure, and the integral structure is a block electrode.

Optionally, the gate electrodes, source electrodes and drain electrodes of the first group of thin film transistors and the second group of thin film transistors are metal electrodes.

Optionally, the pixel electrode is an indium tin oxide thin film.

There is provided, in at least one embodiment of the present disclosure, an array substrate, comprising any one of the pixel structures described above.

There is provided, in at least one embodiment of the present disclosure, a display device, comprising the array substrate described above.

DETAILED DESCRIPTION

Figure 1:
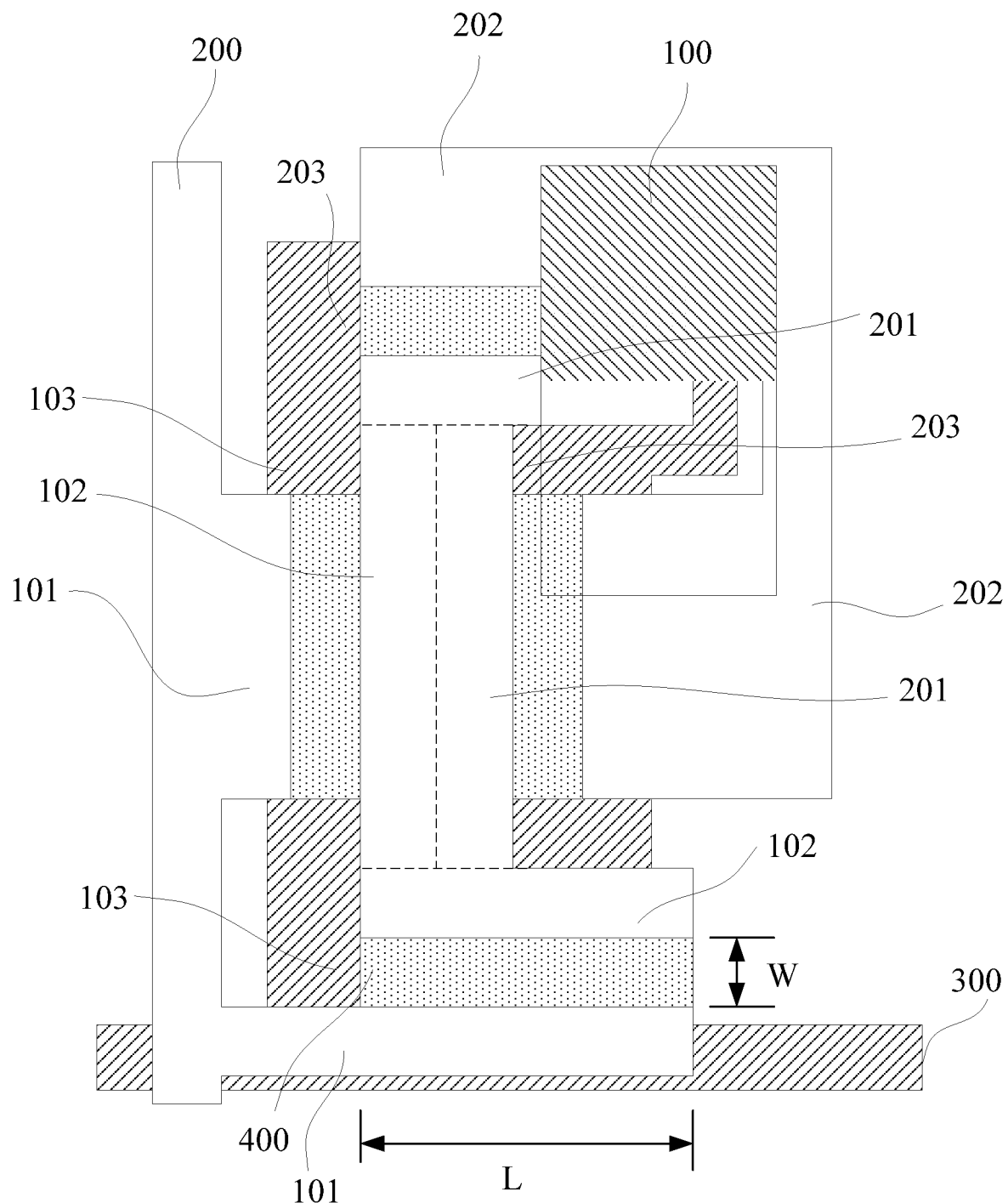
FIG. 1 is a schematic diagram of a structure of a pixel structure according to an embodiment of the present disclosure.

The embodiment of the present disclosure will be described in further detail with reference to the enclosed drawings, to clearly present principle and advantages of the present disclosure.

The inventor(s) realizes that a pixel structure of an electronic paper generally controls the on/off state of a pixel electrode through two TFTs connected in series. When two TFTs are included in the pixel structure, if the pixel electrode leaks current, the leakage current needs to pass through two TFTs. When only one TFT is included in the pixel structure, if the pixel electrode leaks current, the leakage current only needs to pass through one TFT. It can be known that, compared to one TFT, it's more difficult for the pixel electrode to leak current when two TFTs connected in series are arranged in the pixel structure. Thus, the design of two TFTs connected in series may guarantee that the voltage in the pixel electrode lasts for a long period of time.

However, electronic paper having the above pixel structure, especially flexible electronic paper, damages easily under the action of stress. Exemplarily, when the electronic paper bends, the area where a channel is formed in the semiconductor layer in the TFT may break easily since the semiconductor layer does not have enough flexibility. Since two TFTs are connected in series, when the area where a channel is formed in the semiconductor layer in any one of the TFTs, it may cause that the signal cannot be delivered to the pixel electrode, thereby resulting in poor display.

There is provided a pixel structure in the embodiments of the present disclosure. The pixel structure includes a first group of TFTs, a second group of TFTs and a pixel electrode. The first group of TFTs and the second group of TFTs each include at least two thin film transistors. Source electrodes of all the TFTs in the first group of TFTs are connected to the same data line, drain electrodes of all the TFTs in the first group of TFTs are connected to sources electrodes of all the TFTs in the second group of TFTs, drain electrodes of all the TFTs in the second group of TFTs are connected to the pixel electrode, and gate electrodes of all the TFTs in the first group of TFTs and gate electrodes of all the TFTs in the second group of TFTs are connected the same gate line.

In the embodiments of the present disclosure, the two TFTs originally connected in series are changed to two groups of TFTs connected in series and each group of TFTs includes at least two TFTs. The source electrodes of all the TFTs in the first group of TFTs are connected to a data line. The drain electrodes of all the TFTs in the first group of TFTs are connected to the source electrodes of all the TFTs in the second group of TFTs. The drain electrodes of all the TFTs in the second group of TFTs are connected to the pixel electrode. The number of TFT in each group of TFTs is at least two, and the source and drain electrodes are connected in the above way, that is, the source electrodes of a group of TFTs are connected together and the drain electrodes of a group of TFTs are connected together. Thus, even if bending occurs, which results in an area where the channel is formed in a semiconductor layer of a TFT of a group of TFTs is broken and cannot work normally, other TFTs in the group of TFTs can work normally, therefore, the pixel structure can still work normally, thereby avoiding the problem in the prior art that the whole pixel cannot work normally as long as an area where the channel is formed in the semiconductor layer of a TFT is broken, and greatly improving the reliability of the pixel structure. Additionally, this solution does not change the process for manufacturing the pixel structure, which is convenient for implementation.

Exemplarily, the drive integrated circuit (IC) outputs gate signals through gate lines such that the gate electrodes of the first and the second group of TFTs obtain a working voltage. Both of the two groups of TFTs are in an on state, and the data signal provided by the date line passes through the first group of TFTs and the second group of TFTs in sequence to reach the pixel electrode, thereby realizing a writing process of the pixel voltage.

Since each group of TFTs includes at least two TFTs, even if an area where a channel is formed in the semiconductor layer of a TFT is broken and the data signal cannot be transmitted normally, other TFTs in the group of TFTs can still work normally, and therefore the data signal can still be transmitted to the pixel electrode. That is to say, the premise that the pixel structure according to the embodiments of the present disclosure can work normally is that at least one TFT in each group of TFTs can work normally.

FIG. 1 is a schematic diagram of a structure of a pixel structure according to an embodiment of the present disclosure. Referring to FIG. 1, the pixel structure includes a first group of TFTs, a second group of TFTs and a pixel electrode. The first group of TFTs and the second group of TFTs each includes at least two TFTs. The source electrodes 101 of all the TFTs in the first group of TFTs are connected to the same data line 200, the drain electrodes 102 of all the TFTs in the first group of TFTs are connected to the sources electrodes 201 of all the TFTs in the second group of TFTs, the drain electrodes 202 of all the TFTs in the second group of TFTs are connected to the pixel electrode 100, and the gate electrodes 103 of all the TFTs in the first group of TFTs and the gate electrodes 203 of all the TFTs in the second group of TFTs are connected the same gate line 300.

It should be noted that the dashed lines in FIG. 1 are only used to indicate the number of the drain electrodes in the first group of TFTs and the number of the sources electrodes in the second group of TFTs. In practice, the drain electrodes in the first group of TFTs and the sources electrodes in the second group of TFTs are in an integral structure. Since the drain electrodes in the first group of TFTs and the sources electrodes in the second group of TFTs are formed in the same layer, such a design is convenient for manufacture.

Referring to FIG. 1, the first group of TFTs and the second group of TFTs in the pixel structure each include at least two TFTs. Such an arrangement not only meets the needs, but also avoids a complex structure when there are too many TFTs in a group of TFTs. Of course, in other implementations, each group of TFTs may also include more TFTs.

Exemplarily, the number of TFTs in a group of TFTs does not exceed four, thereby avoiding a too complex design and a too difficult manufacture.

In the pixel structure shown in FIG. 1, the number of TFTs in the first group of TFTs is the same as the number of TFTs in the second group of TFTs. The number of TFTs in each group are arranged to be the same, which is convenient for design and manufacture. Of course, in another implementation of the embodiments of the present disclosure, the number of TFTs in the first group of TFTs may also be different from the number of TFTs in the second group of TFTs. For example, the first group of TFTs may include two TFTs, and the second group of TFTs may include three TFTs.

Referring to FIG. 1, the source electrodes 101 of all the TFTs in the first group of TFTs are rectangular electrodes, as shown in FIG. 1, the two source electrodes 101 are located at the right side and the lower side, respectively. The drain electrodes 202 of all the TFTs in the second group of TFTs are also rectangular electrodes, as shown in FIG. 1, the two drain electrodes 202 are formed in an integral structure. That is, the two drain electrodes 202 are connected together to be in a shape of a concave polygon, of course, it may also be in a shape of a convex polygon in other embodiments. The drain electrodes 102 of all the TFTs in the first group of TFTs and the source electrodes 201 of all the TFTs in the second group of TFTs are in an integral structure, which is a convex polygon. Four sides of the convex polygon face toward the two source electrodes 101 and the two drain electrodes 202 respectively, and the convex polygon, the two source electrodes 101 and the two drain electrodes 202 are arranged at intervals, thereby forming an area of channel in the TFT.

In the pixel structure shown in FIG. 1, the shapes of the source electrodes 101 and drain electrodes 102 of all the TFTs in the first group of TFTs and the shapes of the source electrodes 201 and drain electrodes 202 of all the TFTs in the second group of TFTs can be different. In other embodiments, the shapes of the source electrodes 101 and drain electrodes 102 of all the TFTs in the first group of TFTs and the shapes of the source electrodes 201 and drain electrodes 202 of all the TFTs in the second group of TFTs can also designed to be the same.

As shown in FIG. 1, the source electrodes of all the TFTs in the first group of TFTs and the drain electrode 202 of all the TFTs in the second group of TFTs are in a rectangle shape, i.e., four rectangular electrodes. The four rectangular electrodes are arranged around the concave polygons formed by the drain electrodes 102 of all the TFTs in the first group of TFTs and the source electrode 201 of all the TFTs in the second group of TFTs.

In the embodiments of the present disclosure, the width-to-length ratio of a channel of each TFT in the first group of TFTs is W1/(A1*L1), where A1 is the number of TFT in the first group of TFTs, W1/L1 is the width-to-length ratio of the channel of TFT when there is only one TFT in the first group of TFTs. For example, when A1 is 2, the width-to-length ratio of the channel of each TFT in the first group of TFTs is W1/(2*L1). The width-to-length ratio of a channel of each TFT in the second group of TFTs is W2/(A2*L2), where A2 is the number of TFT in the second group of TFTs, W2/L2 is the width-to-length ratio of the channel of TFT when there is only one TFT in the second group of TFTs. Here, W1/L1 and W2/L2 are the width-to-length ratios of the channels adopted by two TFTs when the two existing TFTs are connected in series. The width-to-length ratio of the channel in the TFT is set on this basis of the number of each group of TFTs, such that when one group of TFTs work normally, the performance may be approximate that of the original one TFT. In addition to the electrodes, the TFT further includes a semiconductor layer, i.e., an active layer. The portion of the semiconductor layer between the source electrode and drain electrode forms the abovementioned channel when it's powered on.

In the pixel structure shown in FIG. 1, as the number of TFTs in the first group of TFTs is the same as the number of TFTs in the second group of TFTs, the width-to-length ratios of the channels in the two groups of TFTs are the same. For the convenience of manufacture, the widths and lengths of the areas where the channels are formed in the semiconductor layers of the TFTs are respectively the same. Referring to FIG. 1, the lengths and widths of the area 400 where the channels are formed in the semiconductor layer of the TFTs are respectively L and W, and all the lengths of the areas where the channels are formed in the semiconductor layers of the TFTs are L and all the widths thereof are W.

In the embodiments of the present disclosure, the gate electrodes 103 of the first group of TFTs and the gate electrodes 203 of the second group of TFTs are in an integral structure, and the integral structure is a block electrode. In this way, the gate line only needs to be connected with one gate electrode, which is convenient for manufacturing the gate electrode layer. Referring to FIG. 1, the block electrode may be in a shape of concave polygon, for example, may be an irregular polygon electrode.

Figure 2:
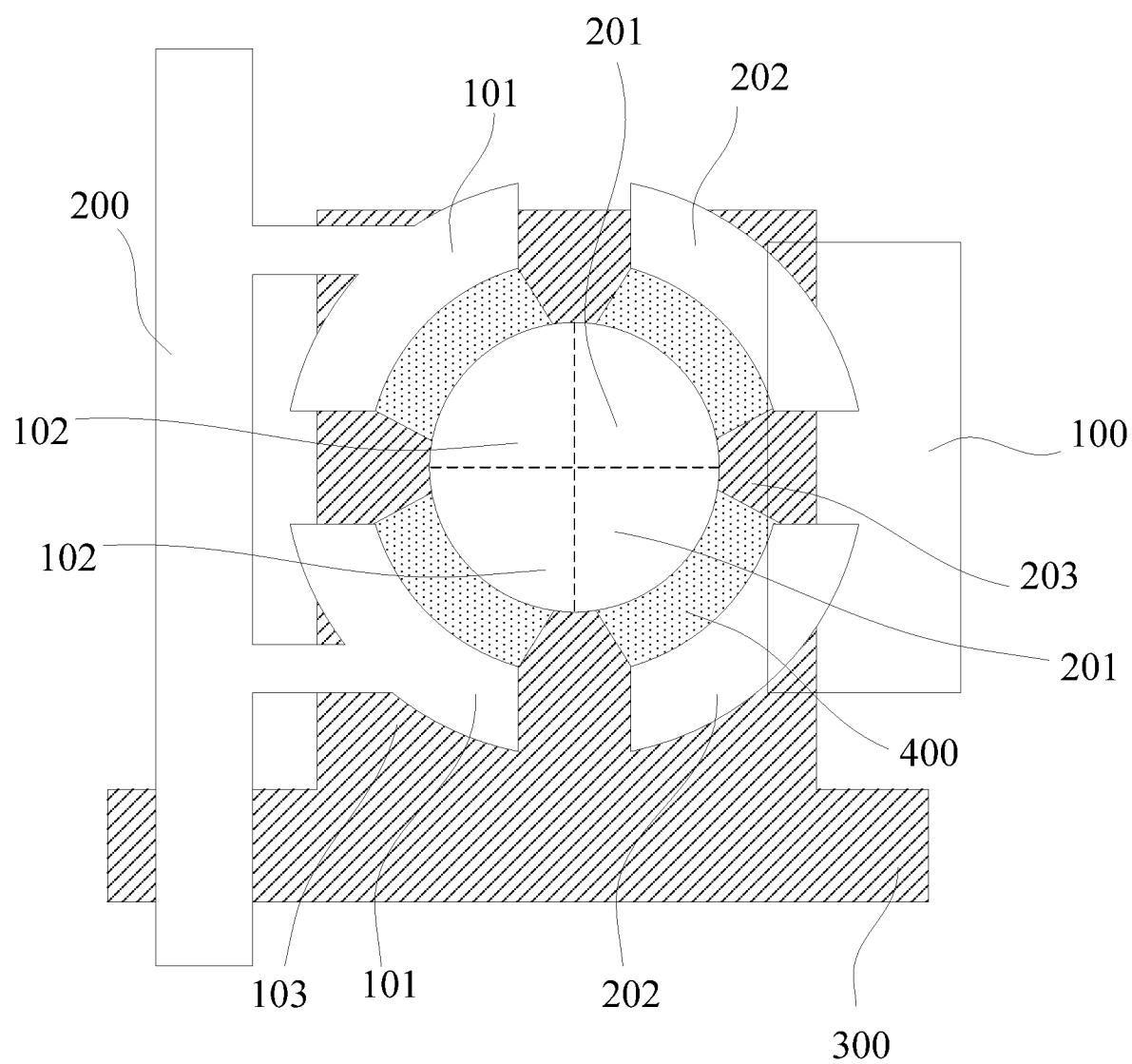
FIG. 2 is a schematic diagram of a structure of another pixel structure according to an embodiment of the present disclosure.

FIG. 2 is a schematic diagram of a structure of another pixel structure according to an embodiment of the present disclosure. Referring to FIG. 2, the difference between this pixel structure and the pixel structure shown in FIG. 1 is that the shapes of the source electrode, drain electrode and gate electrode of the TFT are different.

In the pixel structure shown in FIG. 2, the source and drain patters of TFTs in the first group of TFTs and the second group of TFTs are symmetrically arranged, thereby facilitating the design and manufacture of the source and drain electrodes.

Referring to FIG. 2, the drain electrodes 102 of all the TFTs in the first group of TFTs and the source electrodes 201 of all the TFTs in the second group of TFTs are in an integral structure, and the integral structure is a circular electrode.

Correspondingly, the source electrodes 101 of all the TFTs in the first group of TFTs and the drain electrodes 202 of all the TFTs in the second group of TFTs are arc electrodes, and the arc electrodes are concentrically arranged with the circular electrode. As shown in FIG. 2, the shapes of the source electrodes 101 of all the TFTs in the first group of TFTs are totally the same as the shapes of the drain electrodes 202 of all the TFTs in the second group of TFTs, and the sizes of the source electrodes 101 of all the TFTs in the first group of TFTs are totally the same as the sizes of the drain electrodes 202 of all the TFTs in the second group of TFTs.

Furthermore, the plurality of arc electrodes are distributed evenly at intervals along the circumference of the circular electrode, so as to facilitate manufacture and design.

As shown in FIG. 2, the radians of the four arc electrodes may each be 60°. In the embodiments of the present disclosure, the radian of the arc electrode may be determined according to the number of TFTs in each group of TFTs. For example, the radian of the arc electrode in the first group of TFTs is 360/3A1, where A1 is the number of TFTs in the first group of TFTs; and the radian of the arc electrode in the second group of TFTs is 360/3A2, where A2 is the number of TFTs in the second group of TFTs. As shown in FIG. 2, the number of TFTs in each group of TFTs is two, that is, the values of A1 and A2 are 2. In this case, the radians of all the four arc electrodes may be 60°. Such a design not only ensures that the arc electrodes have a big enough area; but also ensures that there is sufficient space between the arc electrodes, so as to make the arc electrodes separated from each other.

In the implementation, the width-to-length ratio of the channel of each TFT in the first group of TFTs and the width-to-length ratio of the channel of each TFT in the second group of TFTs are designed to be the same to that in the pixel structure shown in FIG. 1. That is, the width-to-length ratio of the channel of each TFT in the first group of TFTs is W1/(A1*L1), and the width-to-length ratio of the channel of each TFT in the second group of TFTs is W2/(A2*L2).

Figure 3:
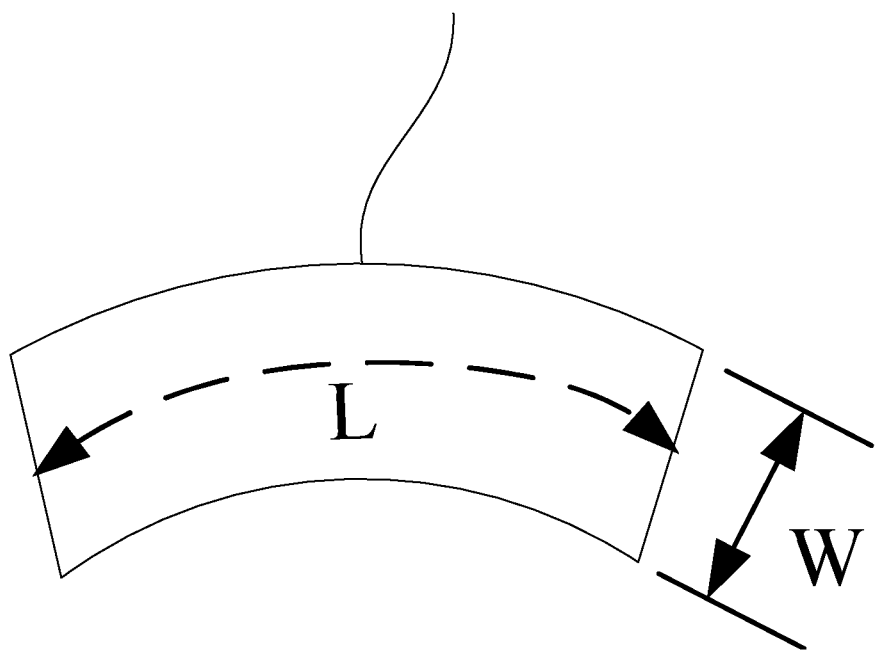
FIG. 3 is a schematic diagram of a structure of an area where a channel is formed in the pixel structure shown in FIG. 2.

Here, when the area 400 where the channel is formed in the semiconductor layer is in an arc shape as shown in FIG. 3, the length of the channel is the length of the arc, i.e., the length L of the dashed lines, and the width of the channel is the width of the arc, i.e., W shown in FIG. 3.

When the source electrodes 101 of all the TFTs in the first group of TFTs and the drain electrodes 202 of all the TFTs in the second group of TFTs are arc electrodes, the diameter of the outer circle of this arc electrode is twice of the diameter of the outer circle of the circular electrode formed by all the drain electrodes 102 of all the TFTs in the first group of TFTs and the source electrodes 201 of all the TFTs in the second group of TFTs. Such a design meets the size requirements of the source electrodes 101 of all the TFTs in the first group of TFTs and the drain electrodes 202 of all the TFTs in the second group of TFTs, and may leave a sufficient gap to ensure the size of the area where the channel is to be formed.

In the embodiments of the present disclosure, the gate electrodes 103 of the first group of TFTs and the gate electrodes 203 of the second group of TFTs are in an integral structure, and the integral structure is a block electrode. In this way, the gate line only needs to be connected to one gate electrode, which is convenient for manufacturing the gate electrode layer.

As shown in FIG. 2, the block electrode may be a polygon with a fixed shape, such as a rectangular electrode.

Figure 4:
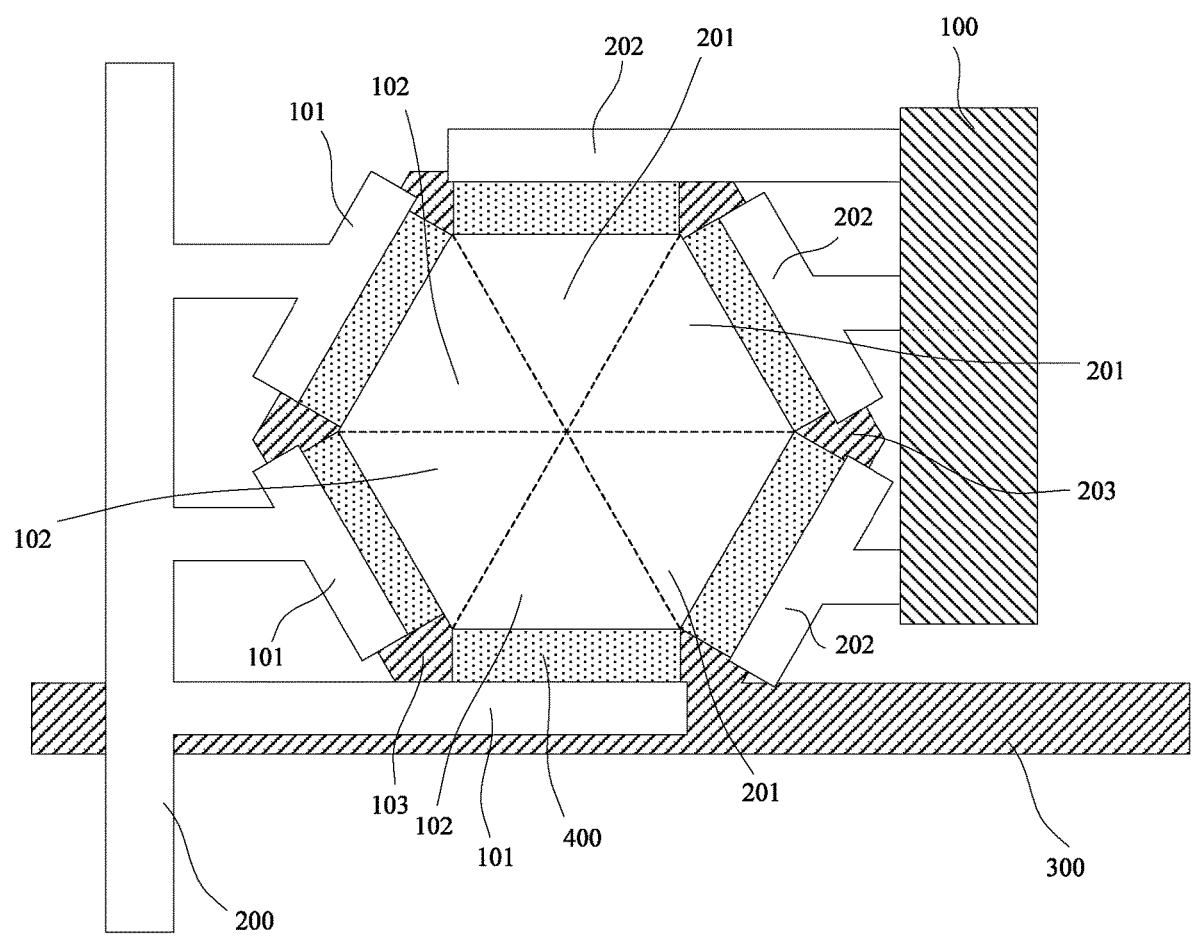
FIG. 4 is a schematic diagram of a structure of yet another pixel structure according to an embodiment of the present disclosure.

FIG. 4 is a schematic diagram of a structure of another pixel structure according to an embodiment of the present disclosure. Referring to FIG. 4, the difference between the pixel structure and the pixel structure provided in FIG. 1 is that the shapes of the source electrode, drain electrode and gate electrode of the TFT are different, and the number of TFTs are also different.

The first group of TFTs and the second group of TFTs in FIG. 4 each include three TFTs. Since each group of TFTs includes three TFTs, when the display panel having such a pixel structure is bent, the area where the channel is formed in the semiconductor layer in one TFT of each group of TFTs is broken, the pixel structure can still work normally. Even if the areas where the channels are formed in the semiconductor layers in two TFTs of each group of TFTs are broken, the pixel structure can still work normally. Therefore, the problem of the pixel display caused by the breakage of the area where the channel is formed in the semiconductor layer in the TFT can be avoided effectively. Of course, in other implementations, each group of TFTs may also include more TFTs, which is not repeated herein.

In the pixel structure shown in FIG. 4, the source electrodes and the drain electrodes of the TFTs in the first group of TFTs and the second group of TFTs are arranged symmetrically, thereby facilitating the design and manufacture of the source electrodes and drain electrodes.

Referring to FIG. 4, the drain electrodes 102 of all the TFTs in the first group of TFTs and the source electrodes 201 of all the TFTs in the second group of TFTs are in an integral structure, and the integral structure is a polygon electrode, such as the hexagon shown in FIG. 4.

Correspondingly, the source electrodes 101 of all the TFTs in the first group of TFTs and the drain electrodes 202 of all the TFTs in the second group of TFTs are long strip electrodes, i.e., rectangular electrodes. Each of the long strip electrodes is arranged corresponding to one side of the polygon electrode respectively, and the length direction of the long strip electrode is parallel with the corresponding side of the long strip electrode in the polygon electrode.

In the embodiments of the present disclosure, the 6 long strip electrodes have the same shapes and the same sizes.

Furthermore, the polygon electrode is in a regular polygon shape, such as the regular hexagon shown in FIG. 4. The number of the sides of the polygon electrode is equal to the sum of the number of TFTs in the first group of TFTs and the number of TFTs in the second group of TFTs. That is, when each group of TFTs includes two TFTs, the polygon electrode is in a square shape. When each group of TFTs includes three TFTs, the polygon electrode is in a hexagon shape, and so forth. The long strip source and drain electrodes are distributed in this way such that each side of the regular polygon corresponds to one long strip electrode, which is convenient of design and manufacture.

In the embodiments of the present disclosure, in addition to the above shapes, the source and drain electrodes of the TFTs may also adopt other shapes, such as a trapezoid, an irregular polygon and the like.

In the implementation, the width-to-length ratio of the channel of each TFT in the first group of TFTs and the second group of TFTs may be designed to be the same as that in the pixel structure shown in FIG. 1. That is, the width-to-length ratio of the channel of each TFT in the first group of TFTs is W1/(A1*L1), and the width-to-length ratio of the channel of each TFT in the second group of TFTs is W2/(A2*L2).

In the embodiments of the present disclosure, when the source electrodes 101 of all the TFTs in the first group of TFTs and the drain electrodes 202 of all the TFTs in the second group of TFTs are long strip electrodes, the size of the long strip electrode can be designed according to the size of the TFT when only one TFT is included in each group of TFTs, while the size of the regular polygon formed by the drain electrodes 102 of all the TFTs in the corresponding first group of TFTs and the source electrodes 201 of all the TFTs in the corresponding second group of TFTs only needs to meet the requirement of the size of the channel. For example, each side of the regular polygon is equal to the length of the long strip electrode.

In the embodiments of the present disclosure, the gate electrodes 103 of the first group of TFTs and the gate electrodes 203 of the second group of TFTs are in an integral structure, and the integral structure is a block electrode. In this way, the gate line only needs to be connected to one gate electrode, which is convenient for manufacturing the gate electrode layer.

As shown in FIG. 4, the shape of the block electrode formed by the gate electrodes 103 of the first group of TFTs and the gate electrodes 203 of the second group of TFTs may be the same as the shape of the polygon formed by the drain electrodes 102 of all the TFTs in the first group of TFTs and the source electrodes 201 of all the TFTs in the second group of TFTs, such as a hexagon.

In the pixel structures shown in FIG. 1, FIG. 2 and FIG. 4, the gate electrodes 103 of the first group of TFTs, the gate electrodes 203 of the second group of TFTs, the drain electrodes 102 of all the TFTs in the first group of TFTs and the source electrodes 201 of all the TFTs in the second group of TFTs are formed by connecting a plurality of portions, and thus may be designed to be hollowed-out patterns, which is not limited in the embodiments of the present disclosure. However, since it's more difficult to manufacture hollowed-out patterns, it is possible to adopt the above non-hollowed-out patterns.

FIG. 1, FIG. 2 and FIG. 4 are all examples of a bottom-gate TFT, but the pixel structure provided in the embodiments of the present disclosure can also be applied to the top-gate TFTs and dual-gate TFTs in addition to the bottom-gate TFTs.

The pixel structure provided in the embodiments of the present disclosure is formed on a base substrate, and the layer relationship in a direction perpendicular to the base substrate (by taking the bottom-gate TFT as an example) may be: a gate electrode layer (gate electrode and gate line), a gate insulating layer, an active layer, a source-drain electrode layer (source electrode, drain electrode and data line), a passivation layer, and a pixel electrode that are sequentially stacked on the base substrate. Here, the pixel electrode is electrically connected to the drain electrode in the source-drain electrode layer through the via-hole formed in the passivation layer.

In the embodiments of the present disclosure, the base substrate may be a glass substrate. The gate insulating layer and the passivation layer may be silicon nitride or silicon oxynitride layers. The pixel electrode may be an Indium Tin Oxides (ITO) thin film layer. The gate electrode layer and the source-drain electrode layer may be metal electrode layers, such as Al (aluminum), Cu (copper), Mo (molybdenum), Cr (chromium), Ti (titanium), etc., and may also be an alloy electrode layer. The active layer may be made of amorphous silicon, microcrystalline silicon, or polycrystalline silicon. For example, the active layer may include an amorphous silicon layer disposed on the gate insulating layer and an N-doped amorphous silicon layer disposed on amorphous silicon layer.

In order to prove that he pixel structure according to the embodiments of the present disclosure may effectively improve the effect of the breakage of the area where the channel is formed in the semiconductor layer of the TFT on the display of electronic paper, the following comparison experiments are further provided in the embodiments of the present disclosure. The experiments are divided into three groups. The two groups of TFTs in the pixel structure used in each group of experiments each include three TFTs, and the width-to-length ratio of the channel of the TFT in each group of TFTs is the width-to-length ratio of the channel of the TFT when only one TFT is included in the group of TFTs. In the three groups of experiments, all TFTs in the first group of experiment are not damaged, the area where the channel is formed in the semiconductor layer of one TFT in a first group of TFTs is damaged in the second group of experiment, and the area where the channel is formed in the semiconductor layer of one TFT in a second group of TFTs is damaged in the third group of experiment. By checking the charging curves of the pixel electrode in the three groups of experiments at 60 us, it can be known that the damage of the area where the channel is formed in the semiconductor layer of one TFT in any group of TFTs has a small effect on the charging efficiency (which may be measured by the voltage charged to the pixel electrode within 60 us), which is within 1.3%. Therefore, the display of the electronic paper will not be affected significantly.

There is further provide an array substrate in the embodiments of the present disclosure. The array substrate includes the pixel structure shown in any one of FIG. 1, FIG. 2 and FIG. 4. The array substrate is suitable for flexible display panels, such as electronic paper or the like.

In the embodiments of the present disclosure, the two TFTs originally connected in series are changed to two groups of TFTs connected in series and each group of TFTs includes at least two TFTs. The source electrodes of all the TFTs in the first group of TFTs are connected to a data line. The drain electrodes of all the TFTs in the first group of TFTs are connected to the source electrodes of all the TFTs in the second group of TFTs. The drain electrodes of all the TFTs in the second group of TFTs are connected to the pixel electrode. The number of TFT in each group of TFTs is at least two, and the source and drain electrodes are connected in the above way, that is, the source electrodes of a group of TFTs are connected together and the drain electrodes of a group of TFTs are connected together. Thus, even if bending occurs, which results in an area where the channel is formed in a semiconductor layer of a TFT of a group of TFTs is broken and cannot work normally, other TFTs in the group of TFTs can work normally, therefore, the pixel structure can still work normally, thereby avoiding the problem in the prior art that the whole pixel cannot work normally as long as an area where the channel is formed in the semiconductor layer of a TFT is broken, and greatly improving the reliability of the pixel structure. Additionally, this solution does not change the process for manufacturing the pixel structure, which is convenient for implementation.

There is further provided a display device in the embodiments of the present disclosure. The display device includes the array substrate described above.

During implementation, the display device according to the embodiments of the present disclosure may be a mobile phone, a tablet computer, a TV, a display, a laptop computer, a digital photo frame, a navigator and any other product or components having a display function.

In the embodiments of the present disclosure, the two TFTs originally connected in series are changed to two groups of TFTs connected in series and each group of TFTs includes at least two TFTs. The source electrodes of all the TFTs in the first group of TFTs are connected to a data line. The drain electrodes of all the TFTs in the first group of TFTs are connected to the source electrodes of all the TFTs in the second group of TFTs. The drain electrodes of all the TFTs in the second group of TFTs are connected to the pixel electrode. The number of TFT in each group of TFTs is at least two, and the source and drain electrodes are connected in the above way, that is, the source electrodes of a group of TFTs are connected together and the drain electrodes of a group of TFTs are connected together. Thus, even if bending occurs, which results in an area where the channel is formed in a semiconductor layer of a TFT of a group of TFTs is broken and cannot work normally, other TFTs in the group of TFTs can work normally, therefore, the pixel structure can still work normally, thereby avoiding the problem in the prior art that the whole pixel cannot work normally as long as an area where the channel is formed in the semiconductor layer of a TFT is broken, and greatly improving the reliability of the pixel structure. Additionally, this solution does not change the process for manufacturing the pixel structure, which is convenient for implementation.

The foregoing descriptions are merely exemplary embodiments of the present disclosure, and are not intended to limit the present disclosure. Within the spirit and principles of the disclosure, any modifications, equivalent substitutions, improvements, etc., shall fall into the protection scope of the appended claims of the present disclosure.

What is claimed is:

1. A pixel structure, comprising a first group of thin film transistors, a second group of thin film transistors and a pixel electrode; wherein the first group of thin film transistors and the second group of thin film transistors each comprises at least two thin film transistors, source electrodes of all the thin film transistors in the first group of thin film transistors are connected to a same data line, drain electrodes of all the thin film transistors in the first group of thin film transistors are connected to sources electrodes of all the thin film transistors in the second group of thin film transistors, drain electrodes of all the thin film transistors in the second group of thin film transistors are connected to the pixel electrode, and gate electrodes of all the thin film transistors in the first group of thin film transistors and gate electrodes of all the thin film transistors in the second group of thin film transistors are connected a same gate line; and the drain electrodes of all the thin film transistors in the first group of thin film transistors and the source electrodes of all the thin film transistors in the second group of thin film transistors are in an integral structure, and the integral structure is one of a circular electrode and a polygon electrode.

2. The pixel structure according to claim 1, wherein the first group of thin film transistors comprises 2-4 thin film transistors, and the second group of thin film transistors comprises 2-4 thin film transistors.

3. The pixel structure according to claim 1, wherein a number of the thin film transistors in the first group of thin film transistors is the same as a number of the thin film transistors in the second group of thin film transistors.

4. The pixel structure according to claim 1, wherein the integral structure is the circular electrode, the source electrodes of all the thin film transistors in the first group of thin film transistors and the drain electrodes of all the thin film transistors in the second group of thin film transistors are arc electrodes, and the arc electrodes are concentrically arranged with the circular electrode.

5. The pixel structure according to claim 4, wherein the arc electrodes are distributed evenly at intervals along a circumference of the circular electrode.

6. The pixel structure according to claim 4, wherein a diameter of an outer circle of each of the arc electrodes is twice of a diameter of an outer circle of the circular electrode.

7. The pixel structure according to claim 4, wherein a radian of the arc electrode in the first group of thin film transistors is 360°/3A1, and A1 is a number of the thin film transistors in the first group of thin film transistors; wherein a radian of the arc electrode in the second group of thin film transistors is 360°/3A2, and A2 is a number of the thin film transistors in the second group of thin film transistors.

8. The pixel structure according to claim 1, wherein the integral structure is the polygon electrode, the source electrodes of all the thin film transistors in the first group of thin film transistors and the drain electrodes of all the thin film transistors in the second group of thin film transistor are long strip electrodes.

9. The pixel structure according to claim 8, wherein each of the long strip electrodes is arranged corresponding to a side of the polygon electrode respectively, and a length direction of the long strip electrode is parallel with the corresponding side of the long strip electrode in the polygon electrode.

10. The pixel structure according to claim 8, wherein a number of sides of the polygon electrode is equal to a sum of a number of the thin film transistors in the first group of thin film transistors and a number of the thin film transistors in the second group of thin film transistors.

11. The pixel structure according to claim 10, wherein the polygon electrode is in a regular polygon shape.

12. The pixel structure according to claim 1, wherein a width-to-length ratio of a channel of each thin film transistor in the first group of thin film transistors is $W1/(A1*L1)$, A1 is a number of the thin film transistors in the first group of thin film transistors, MU is a width-to-length ratio of the channel of the thin film transistor when only one thin film transistor is included in the first group of thin film transistors; and a width-to-length ratio of a channel of each thin film transistor in the second group of thin film transistors is $W2/(A2*L2)$, A2 is a number of the thin film transistors in the second group of thin film transistors, $W2/L2$ is a width-to-length ratio of the channel of thin film transistor when only one thin film transistor is included in the second group of thin film transistors.

13. The pixel structure according to claim 1, wherein the gate electrodes of the first group of thin film transistors and the second group of thin film transistors are in an integral structure, and the integral structure is a block electrode.

14. The pixel structure according to claim 1, wherein the gate electrodes, source electrodes and drain electrodes of the first group of thin film transistors and the second group of thin film transistors are metal electrodes.

15. The pixel structure according to claim 1, wherein the pixel electrode is an indium tin oxide thin film.

16. An array substrate, comprising: a pixel structure, wherein the pixel structure comprises a first group of thin film transistors, a second group of thin film transistors and a pixel electrode; wherein the first group of thin film transistors and the second group of thin film transistors each comprises at least two thin film transistors, source electrodes of all the thin film transistors in the first group of thin film transistors are connected to a same data line, drain electrodes of all the thin film transistors in the first group of thin film transistors are connected to sources electrodes of all the thin film transistors in the second group of thin film transistors, drain electrodes of all the thin film transistors in the second group of thin film transistors are connected to the pixel electrode, and gate electrodes of all the thin film transistors in the first group of thin film transistors and gate electrodes of all the thin film transistors in the second group of thin film transistors are connected a same gate line; and the drain electrodes of all the thin film transistors in the first group of thin film transistors and the source electrodes of all the thin film transistors in the second group of thin film transistors are in an integral structure, and the integral structure is one of a circular electrode and a polygon electrode.

17. A display device, comprising: an array substrate comprising a pixel structure, wherein the pixel structure comprises a first group of thin film transistors, a second group of thin film transistors and a pixel electrode; wherein the first group of thin film transistors and the second group of thin film transistors each comprises at least two thin film transistors, source electrodes of all the thin film transistors in the first group of thin film transistors are connected to a same data line, drain electrodes of all the thin film transistors in the first group of thin film transistors are connected to sources electrodes of all the thin film transistors in the second group of thin film transistors, drain electrodes of all the thin film transistors in the second group of thin film transistors are connected to the pixel electrode, and gate electrodes of all the thin film transistors in the first group of thin film transistors and gate electrodes of all the thin film transistors in the second group of thin film transistors are connected a same gate line; and the drain electrodes of all the thin film transistors in the first group of thin film transistors and the source electrodes of all the thin film transistors in the second group of thin film transistors are in an integral structure, and the integral structure is one of a circular electrode and a polygon electrode.

18. The pixel structure according to claim 2, wherein a number of the thin film transistors in the first group of thin film transistors is the same as a number of the thin film transistors in the second group of thin film transistors.

\* \* \* \* \*